United States Patent
Izumino

(10) Patent No.: US 7,417,915 B2
(45) Date of Patent: Aug. 26, 2008

(54) MULTIPORT MEMORY DEVICE

(75) Inventor: Hitoshi Izumino, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/370,808

(22) Filed: Mar. 9, 2006

(65) Prior Publication Data

US 2006/0203597 A1    Sep. 14, 2006

(30) Foreign Application Priority Data

Mar. 10, 2005    (JP)    ............... 2005-067153

(51) Int. Cl.
*G11C 8/00* (2006.01)
(52) U.S. Cl. ............... 365/230.05; 365/189.05; 365/230.08; 365/233
(58) Field of Classification Search ............ 365/230.05, 365/189.05, 230.08, 233; 327/116
See application file for complete search history.

(56) References Cited

U.S. PATENT DOCUMENTS 5,789,953 A * 8/1998 Au et al. ............... 327/116
7,184,359 B1 * 2/2007 Bridgewater et al. ........ 365/233
2001/0006211 A1 * 7/2001 Choi et al. ............... 250/208.2
2003/0218928 A1 * 11/2003 Tanizaki et al. ........... 365/201

FOREIGN PATENT DOCUMENTS

| JP | 7-84987 | 3/1995 |
| JP | 8-279292 | 10/1996 |
| JP | 2004-127440 | 4/2004 |

* cited by examiner

*Primary Examiner*—Hoai V. Ho
*Assistant Examiner*—Jason Lappas
(74) *Attorney, Agent, or Firm*—McGinn IP Law Group, PLLC

(57) ABSTRACT

A multiport memory device according to an embodiment of the invention includes first and second input ports, first and second output ports, and a memory cell array. The device further includes: an input data selector for selecting one of the first and second input ports to send input data to the memory cell array; and an output data selector for selecting one of the output ports to output the data from the memory cell array to the selected output port. The device further includes a clock doubling circuit for supplying a doubled clock to the input data selector, the output data selector, and the memory cell array. The clock doubling circuit selects a higher-frequency one of a first clock corresponding to data input from the first input port and a second clock corresponding to data input from the second input port to double its frequency to generate a doubled clock.

11 Claims, 5 Drawing Sheets

MULTIPORT MEMORY DEVICE

BACKGROUND OF THE INVENTION

1. Field of the Invention

The present invention relates to a multiport memory device. In particular, the invention relates to a multiport memory device including plural input/output ports that operate at different clock frequencies.

2. Description of Related Art

Along with recent advancements of semiconductor technologies, smaller-size and larger-capacity memories that allow high-speed reading/writing operations have been developed. Further, a so-called multiport memory including plural input ports and output ports has been used for simultaneously reading/writing data of different addresses.

Hitherto, extensive studies have been made on the multiport memory. For example, Japanese Unexamined Patent Application Publication No. 8-279292 (hereinafter, referred to as "Related Art 1") discloses a multiport memory where an address decoder is shared to reduce a circuit area.

The multiport memory described in Related Art 1 receives address data from two input ports that are switched by the address decoder. Then, a memory cell array operates at a doubled clock speed to process the data input from the two input ports. Thus, a single address decoder and a single memory cell array suffice for. In this way, an area for the multiport memory can be saved and a two-input system is realized.

The related multiport memory is described in brief. FIG. 4 is a block diagram showing the configuration of a conventional multiport memory device as described in Related Art 1, for example. A multiport memory device 2 of FIG. 4 includes a memory cell array 20, an input control circuit 21, an output control circuit 22, and a clock doubling circuit 23.

FIG. 5 is a timing chart showing a processing flow of the related multiport memory. An input clock of FIG. 5 is supplied to input data holding flip flops 210 and 211 in the input control circuit 21, and output data holding flip flops 222 and 223 in the output control circuit 22. This input clock is also supplied to the clock doubling circuit 23. The clock doubling circuit 23 doubles an input clock speed to generate a doubled clock as shown in FIG. 5. Then, the doubled clock is supplied to the memory cell array 20, an address decoder 212 in the input control circuit 21, and data holding latches 220 and 221 in the output control circuit 22.

Further, the clock doubling circuit 23 generates a selection signal based on the doubled clock, and supplies the generated selection signal to an input data selector 213 in the input control circuit 21 and an output data selector 224 in the output control circuit 22. Regarding the selection signal of FIG. 5, a portion A of FIG. 5 corresponds to a selection signal_A for selecting an input signal from an input port A, and a portion B corresponds to a selection signal_B for selecting an input signal from an input port B. These signals are output from the clock doubling circuit 23. The input data selector 213 receives the selection signals from the clock doubling circuit 23. The input data selector 213 selects one of the input data holding flip flop 210 and the input data holding flip flop 211 of the input control circuit 21 in response to the selection signal to receive input data (address data) from the input port A or the input port B. The input data selector 213 outputs the received address data to the address decoder 212.

Subsequently, a processing flow of the multiport memory device 2 described in Related Art 1 is explained in brief. The multiport memory device 2 receives address data from the two input ports, the input port A and the input port B. The input port A is connected with the input data holding flip flop 210 in the input control circuit 21. The input port B is connected with the input data holding flip flop 211.

The input data holding flip flop 210 and the input data holding flip flop 211 receive the same input clock to execute a data input processing from the input port A and the input port B in accordance with the input clock. Each input processing is executed at input-port timings of (0) to (2) of FIG. 5.

The input data selector 213 selects one of the input data holding flip flop 210 and the input data holding flip flop 211. As a result, the address data input from either the input port A or the input port B is supplied to the address decoder 212. That is, the input data selector 213 receives the selection signal from the clock doubling circuit 23 to select one of the input data holding flip flops 210 and 211 in accordance with the selection signal, and receive the address data held in the selected input data holding flip flop. Then, the selector sends the received data to the address decoder 212.

The address decoder 212 decodes the address data received from the input data selector 213 to read data stored at a corresponding address in the memory cell array 20. This processing is executed at a reading-processing timing of FIG. 5.

The memory cell array 20 outputs the thus-read data (hereinafter, referred to as "read data") to the output data selector 224 in the output control circuit 22. The output data selector 224 selects one of the data holding latch 220 and the data holding latch 221 in accordance with the selection signal from the clock doubling circuit 23. Then, the selector sends the read data supplied from the memory cell array 20, to the selected data holding latch.

The data holding latch 220 outputs the read data to the output data holding flip flop 222 based on the doubled clock from the clock doubling circuit 23. Likewise, the data holding latch 221 outputs the read data to the output data holding flip flop 223 based on the doubled clock from the clock doubling circuit 23.

The output data holding flip flop 222 sends the received read data to the output port A. Similarly, the output data holding flip flop 223 sends the received read data to the output port B. The output data holding flip flop 222 and the output data holding flip flop 223 receive an input clock not subjected to a speed doubling processing, instead of the doubled clock, and then execute output processings in accordance with the input clock. The output processing is executed at output-port timings of (0) to (2) of FIG. 5.

In this way, in the multiport memory device of Related Art 1, the memory cell array operates at a doubled clock speed to process data input from the two input ports. Thus, a single address decoder and a single memory cell array suffice therefor. Accordingly, an area can be reduced, and a two-input system is realized.

However, in the multiport memory of Related Art 1, the same input clock is applied to the respective input data holding flip flops 210 and 211. Hence, the input clocks used for each port are limited to the same frequency, so the technique of Related Art 1 can be used only for an application where all ports operate with the same frequency.

Further, there have been proposed a dual-port memory where an internal clock speed is doubled to support two input and output ports (for example, Japanese Unexamined Patent Application Publication No. 7-84987) and a multiport memory where a higher-frequency one of a write clock and a read clock is selected and its clock speed is doubled (for example, Japanese Unexamined Patent Application Publication No. 2004-127440), but either memory has a problem in that the memory cannot operate unless clocks applied to input ports have the same clock frequency and phase.

Incidentally, in the case of using plural input ports, many users demand to operate the input ports at different clock frequencies. In such a case, albeit the same frequency, the input clocks may be out of phase. However, the related multiport memory has a problem of being unable to operate if the input clocks are different in clock frequency or phase.

SUMMARY OF THE INVENTION

A multiport memory device according to an aspect of the present invention includes: a first input port; a second input port; a first output port; a second output port; a memory cell array; an input data selector for selecting one of input data from the first input port and input data from the second input port to output the input data to the memory cell array; an output data selector for selecting one of the first output port and the second output port to output the data from the memory cell array; and a clock doubling circuit for supplying a higher-frequency one of a first clock corresponding to the data input from the first input port and a second clock corresponding to the data input from the second input port to the input data selector, the output data selector, and the memory cell array.

Based on this configuration, the clock doubling circuit processes the input data selected with the input data selector at double speed to allow data input from two ports. Further, a clock selector selects a higher-frequency clock, making it possible to process data supplied at different clocks.

A multiport memory device according to another aspect of the invention includes: at least n input ports; at least n output ports; an input data selector for selecting one of input data from the input ports to output the selected data to a memory cell array; an output data selector for selecting one of the output ports to output the data from the memory cell array; and a clock doubling circuit for selecting the highest-frequency clock from n clocks corresponding to the n input ports to multiply a frequency of the selected clock by n or more to supply the obtained clock to the input data selector, the output data selector, and the memory cell array. Based on this configuration, the clock doubling circuit processes the input data selected with the input data selector at double speed to allow data input from two or more ports. Further, a clock selector selects a higher-frequency clock, making it possible to process data supplied at different clocks.

According to the present invention, it is possible to provide a multiport memory capable of processing plural clock signals that are input at different clock frequencies and phases.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
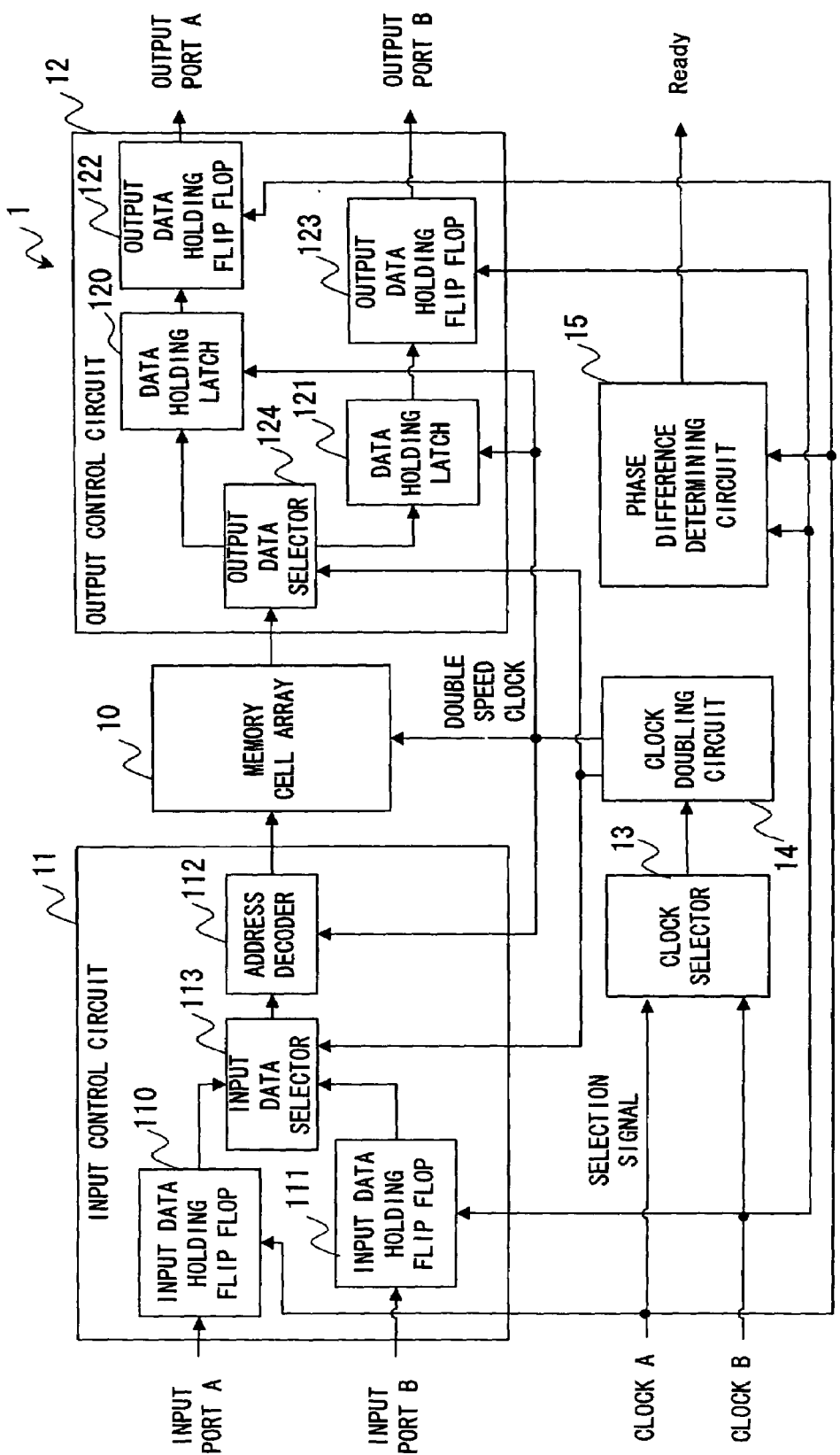
FIG. 1 is a block diagram showing the configuration of a multiport memory device according to an embodiment of the present invention.

FIG. 1 is a block diagram showing the configuration of a multiport memory device 1 according to an embodiment of the present invention. The multiport memory device 1 includes a memory cell array 10, an input control circuit 11, an output control circuit 12, a clock selector 13, a clock doubling circuit 14, and a phase difference determining circuit 15.

The memory cell array 10 stores data in the multiport memory device 1. The input control circuit 11 controls data input from input ports A and B to output data to be stored in the memory cell array 10. The input control circuit 11 includes input data holding flip flops 110 and 111, an address decoder 112, and an input data selector 113. Incidentally, the following description proceeds in accordance with a procedure of a reading operation by way of example. However, the same applies to a writing operation.

The input data holding flip flop 110 holds address data input from the input port A, and outputs the address data to the input data selector 113 in response to a clock A. The input data holding flip flop 111 holds address data input from the input port B, and outputs the address data to the input data selector 113 in response to a clock B.

The input data selector 113 selects one of the input data holding flip flop 110 and the input data holding flip flop 111 in accordance with a selection signal from the clock doubling circuit 14 to receive address data from the selected flip flop and send the received address data to the address decoder 112. The address decoder 112 decodes the received address data, and then reads a value corresponding to an address of the memory cell array 10 represented by the decoded data.

The output control circuit 12 executes control to output data stored in the memory cell array 10 to two different ports (output ports A and B). The output control circuit 12 includes data holding latches 120 and 121, output data holding flip flops 122 and 123, and an output data selector 124.

The output data selector 124 receives data read from the memory cell array 10 (hereinafter, referred to as "read data"), and then outputs the read data to a selected one of the data holding latches 120 and 121 in response to a selection signal supplied from the clock doubling circuit 14.

The data holding latch 120 holds the read data sent from the output data selector 124, and then outputs the read data to the output data holding flip flop 122 in step with a doubled clock from the clock doubling circuit 14. The data holding latch 121 holds the read data sent from the output data selector 124 and then outputs the data to the output data holding flip flop 123 in step with a doubled clock from the clock doubling circuit 14.

The output data holding flip flop 122 holds the read data supplied from the data holding latch 120 and then outputs the held read data to the output port A based on a clock A. The output data holding flip flop 123 holds the read data supplied from the data holding latch 121 and then outputs the held read data to the output B based on a clock B.

The clock selector 13 receives two clocks, the clock A and the clock B, and applies a selected one to the clock doubling circuit 14. The clock doubling circuit 14 doubles a speed of the clock A or clock B supplied from the clock selector 13 to supply the doubled clock to the memory cell array 10, the address decoder 112, and the data holding latches 120 and 121. Further, the clock doubling circuit 14 generates a selection signal in accordance with the doubled clock to apply the generated clock to the input data selector 113 and the output data selector 124. In this embodiment, the term "doubled clock" refers to a clock obtained by doubling a frequency of the clock A or clock B. However, a three or more-fold frequency may be used. For example, if the clock A or clock B has a frequency of 100 Mhz, a target frequency may be 200 Mhz or higher.

The phase difference determining circuit 15 receives the two clocks, clock A and clock B to detect a phase difference therebetween. If the detected phase difference is equal to or smaller than a predetermined limit value, input timings can be controlled, so the circuit determines that a proper operation is guaranteed. In such a case, the phase difference determining circuit 15 issues a signal to the effect that the proper operation is guaranteed.

Figure 2:
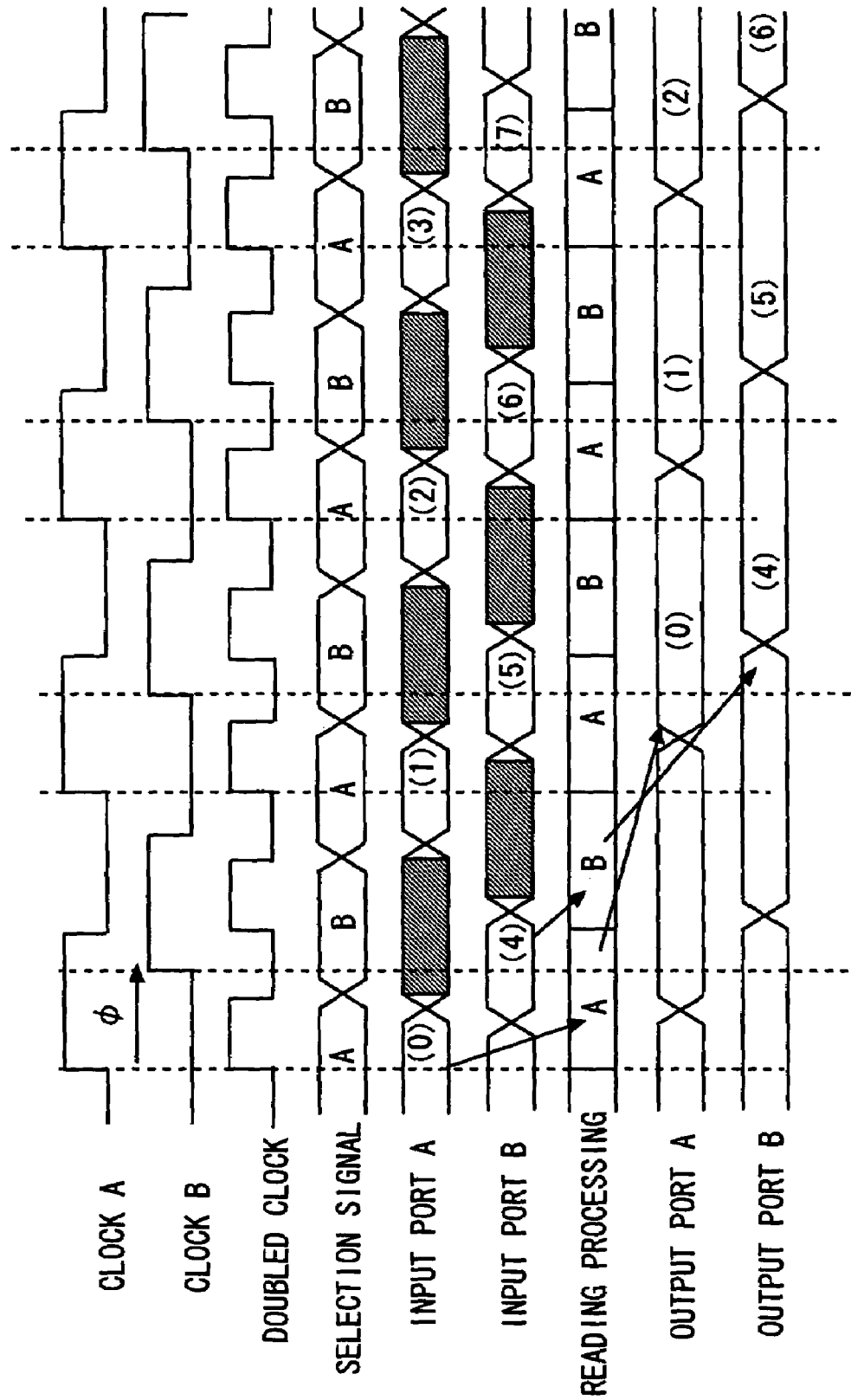
FIG. 2 is a timing chart showing a processing flow of the multiport memory device according to the embodiment of the present invention.

Referring next to a timing chart of FIG. 2, a processing flow of the multiport memory device 1 according to the first embodiment of the present invention is described. In the illustrated example of FIG. 2, the input clocks (clock A and clock B) for the two input ports have the same frequency but are out of phase; that is, there is a phase difference between the two clocks.

First, the clock selector 13 receives the two clocks, clock A and clock B. The clock selector 13 is set to select a higher-frequency clock if the selector knows which one of the input clocks A and B has a higher frequency. Alternatively, if the frequencies of the clocks A and B vary, the clock selector detects the frequencies of the clocks A and B to select a higher-frequency clock. Otherwise, an appropriate one of the two clocks may be selected in accordance with an external selection signal.

In the illustrated example of FIG. 2, the two clocks have the same frequency. Thus, the clock doubling circuit 14 doubles a frequency of the clock A, for example to supply the doubled clock to the memory cell array 10, the input control circuit 11, and the output control circuit 12. Incidentally, when the two clocks have different clock frequencies, the clock doubling circuit 14 doubles a higher one of the clock frequencies to supply the doubled clock to the memory cell array 10, the input control circuit 11, and the output control circuit 12.

In FIG. 2, the clock A is input to the input data holding flip flop 110 as described above. In addition, the clock B is input to the input data holding flip flop 111. Further, a doubled clock which is obtained by doubling a frequency with the clock doubling circuit 14 is input to the memory cell array 10, the address decoder 112, and the data holding latches 120 and 121.

In the timing chart of FIG. 2, a rising edge of the clock A appears in advance of that of the clock B by. Here, J represents a time difference between the rising edge of the clock A and the rising edge of the clock B. Incidentally, if the time difference between the rising edge of the clock A and the rising edge of the clock B is larger than a time difference between the rising edge of the clock B and the rising edge of the clock A, $\phi$ represents the time difference between the rising edge of the clock B and the rising edge of the clock A. That is, $\phi$ represents a smaller one of the time difference between the rising edge of the clock A and the rising edge of the clock B and the time difference between the rising edge of the clock B and the rising edge of the clock A.

Each of portions A and B of the selection signal of FIG. 2 denotes a kind of the selection signal to be output to the input data selector 113 and the output data selector 124. The selection signal is switched between A and B in accordance with the doubled clock. If the selection signal is A (selection A signal), the input data selector 113 selects the input data holding flip flop 110, and the output data selector 124 selects the data holding latch 120. On the other hand, if the selection signal is B (selection B signal), the input data selector 113 selects the input data holding flip flop 111, and the output data selector 124 selects the data holding latch 121.

A flow of an address input processing is described. First of all, address data are individually supplied from the two input ports A and B. The address data from the input port A is sent to the input data holding flip flop 110; the address data from the input port B is sent to the input data holding flip flop 111. The individual address data are input in step with the clocks A and B. Address data input timings (0) to (3) of the input port A of FIG. 2 are timings at which the address data from the input port A is input to the input data holding flip flop 110. The address data input timings (0) to (3) of the input port A match with timings of the clock A.

Further, address data input timings (4), (5), (6), and (7) of the input port B of FIG. 2 are timings at which the address data from the input port B is input to the input data holding flip flop 111. The address data input timings (4), (5), (6), and (7) of the input port B match with timings of the clock B.

The input data selector 113 selects one of the address data from the input port A and that from the input port B to send the selected data to the address decoder 112. It is determined which one of the address data from the input port A and the address data from the input port B is selected, in accordance with a selection signal from the clock doubling circuit 14. Portions A and B of the selection signal of FIG. 2 are signals for selecting data from the input port A and the input port B, respectively.

It is necessary to store the address data in the input data holding flip flops 110 and 111 until the input data selector 113 selects and outputs the address data. In addition, in order to execute normal data reading/writing operations, the phase difference $\phi$ needs to match with such timings. A limit value of the time difference $\phi$ that matches with such timings can be determined by experiment.

The phase difference determining circuit 15 detects a phase difference between the two clocks A and B. As a result of comparing the detected phase difference $\phi$ with the limit value, if the phase difference is equal to or smaller than the limit value, the input timings can be controlled. Hence, the circuit determines that the proper operation is guaranteed. In this case, the phase difference determining circuit 15 sends a Ready signal to the effect that the proper operation is guaranteed. No particular limitation is imposed on where to output, but the signal may be sent to a control unit incorporating or connected with the multiport memory device 1. Thus, the control unit can speedily execute subsequent processings. Conversely, if the comparison result shows that the phase difference $\phi$ is larger than the limit value, the input timings cannot be controlled, so the phase difference determining circuit 15 determines that the proper operation is not guaranteed, and sends a signal to that effect.

Figure 3:
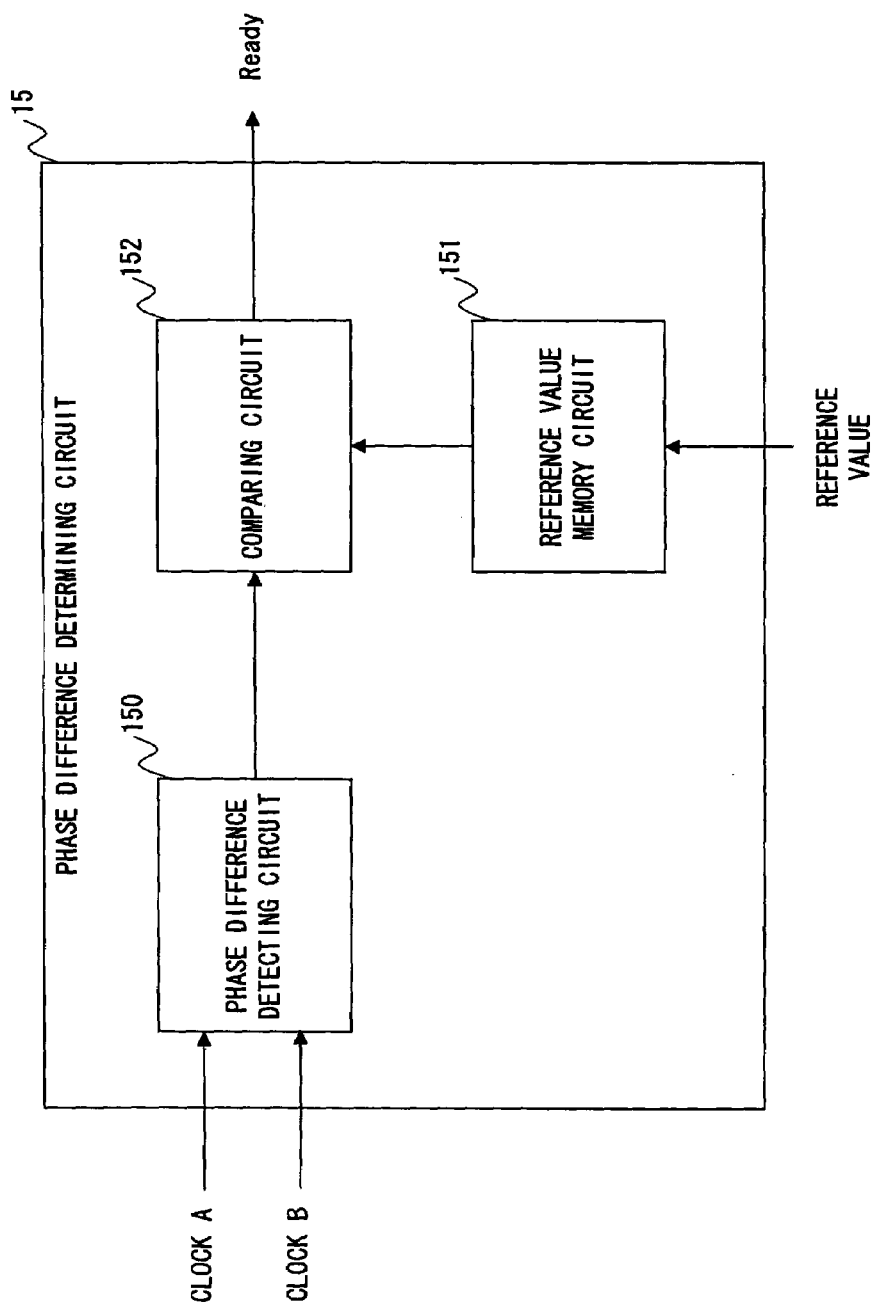
FIG. 3 shows an example of a phase difference determining circuit of the multiport memory device according to the embodiment of the present invention.
Figure 4:
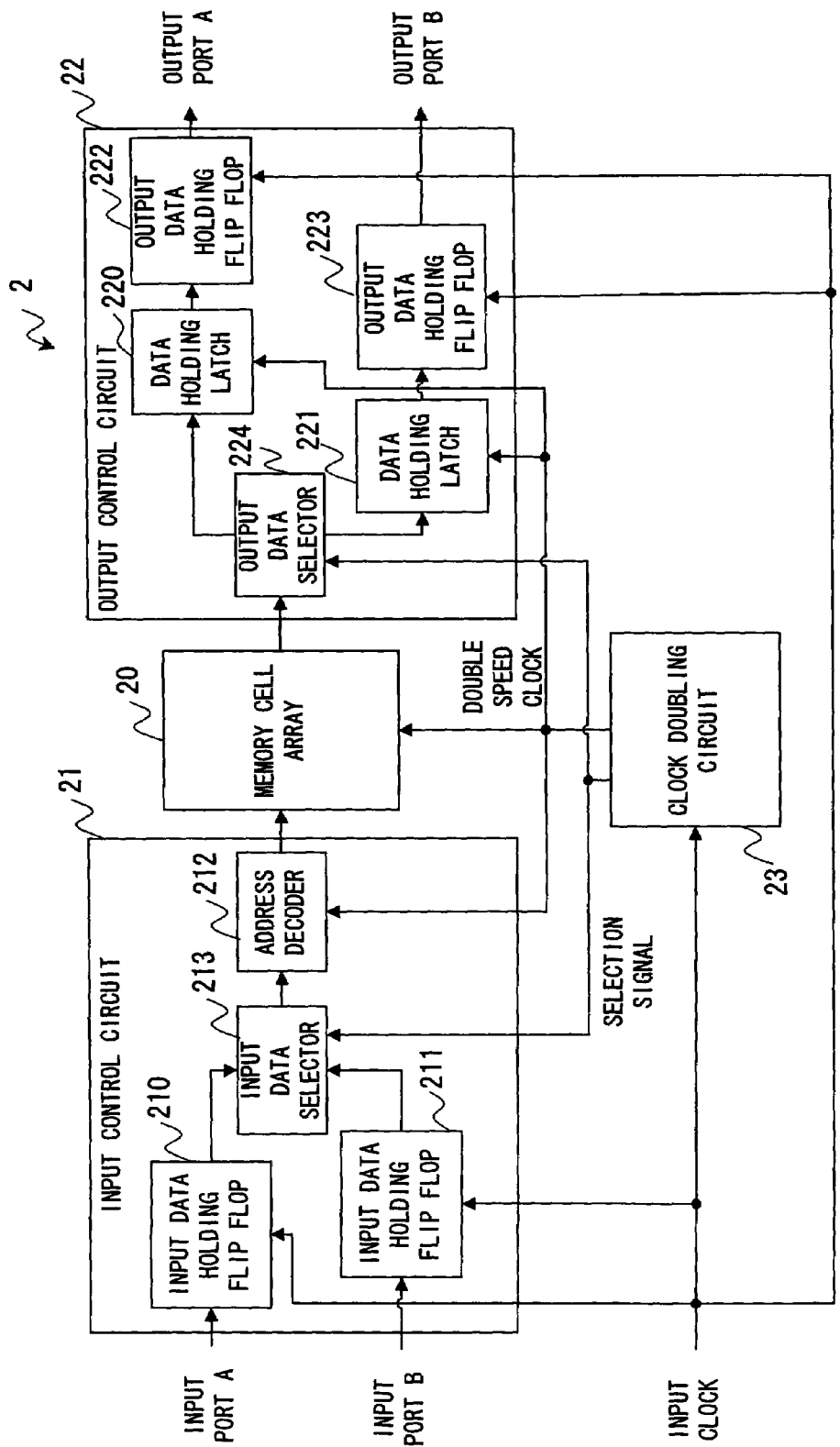
FIG. 4 is a block diagram showing the configuration of a multiport memory device of the related art.
Figure 5:
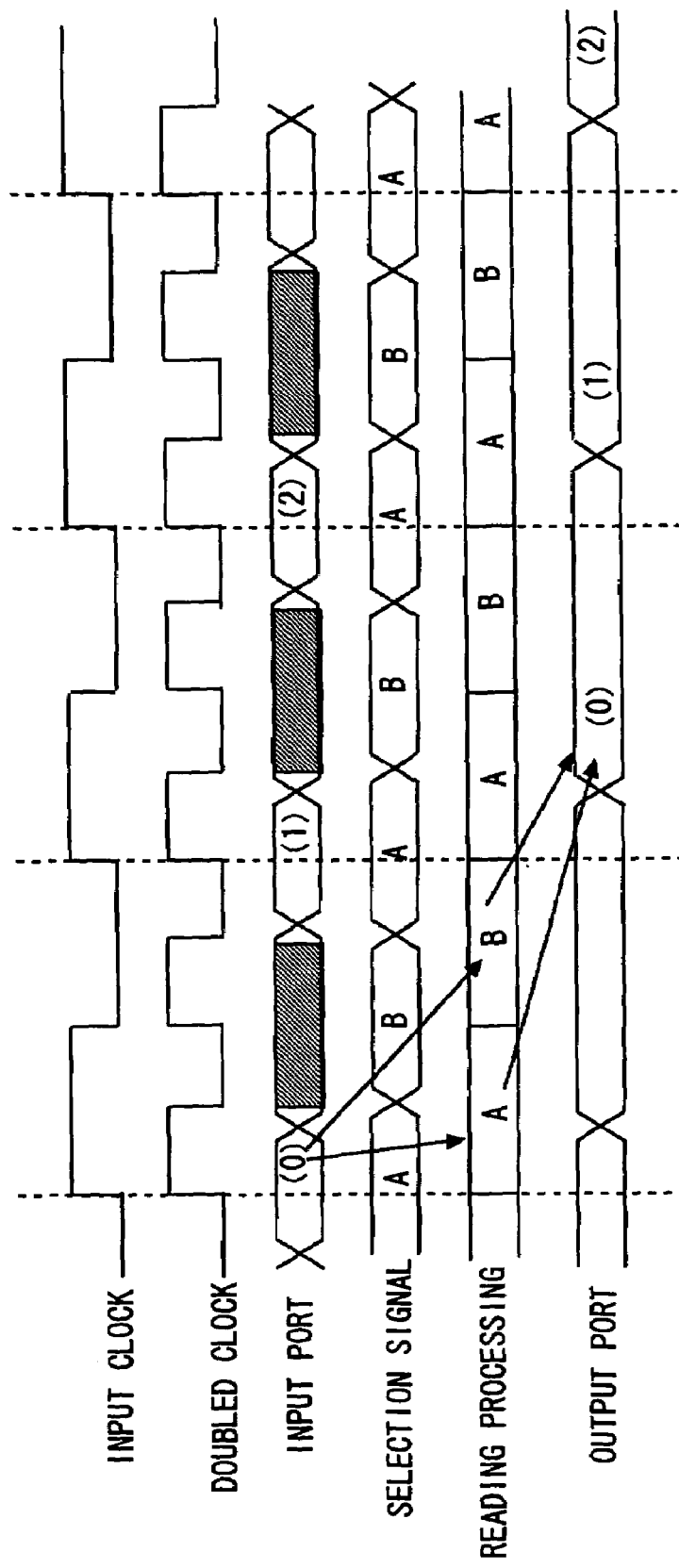
FIG. 5 is a timing chart showing a processing flow of the multiport memory device of the related art.

FIG. 3 is a circuit diagram showing the circuit configuration of the phase difference determining circuit 15 according to this embodiment. The phase difference determining circuit 15 includes a phase difference detecting circuit 150, a reference value memory circuit 151, and a comparing circuit 152.

The phase difference detecting circuit 150 receives the clocks A and B to output a phase difference $\phi$ therebetween as a phase difference signal to the comparing circuit 152. The reference value memory circuit 151 sends a reference value (limit value) that defines an allowable range of the phase difference as a reference value signal to the comparing circuit 152. The reference value memory circuit 151 may store the reference value as a fixed value. Alternatively, a variable reference value may be externally supplied and used as a reference value signal.

As an example of a method of detecting a phase difference with the phase difference detecting circuit 150, there is a method of converting a phase difference into a voltage, and comparing the voltage level with a reference voltage level. For example, assuming that the two input clocks are the clocks A and B, a flip flop is set on the rising edge of the clock A, and then reset on the rising edge of the other clock, the clock B, so a phase difference is converted into a pulse width. Provided that the pulse width is t1, charges stored in a capacitor having a given capacity are released so as to supply a predetermined amount of current during a period t1, so the phase difference is converted into a voltage. If C represents the capacity of the capacitor, Q represents an amount of the charges stored in the capacitor, and i represents a current amount during the discharge, an initial voltage is represented by $V0=Q/C$, and a voltage at the time of detecting the phase difference is represented by $V1=V0-(i*t1)/C$. The phase difference can be derived from the above voltage. In the case of detecting the phase difference again, the capacitor is charged after the detection to enable the repetitive operation. The thus-detected phase difference is sent to the comparing circuit 152 as a phase difference signal.

The comparing circuit 152 compares the phase difference signal from the phase difference detecting circuit 150 with a reference value from reference value memory circuit 151 to output the comparison result as a comparison result signal.

A limit value used as a reference for determining whether the multiport memory device 1 can guarantee the proper operation is determined by experiment beforehand, and input to the phase difference determining circuit 15. At this time, the limit value input to the phase difference determining circuit 15 may vary. That is, a new limit value may be written to the Reference Value Memory Circuit 151 of Phase Difference Determining Circuit 15. The new limit value would overwrite the previous limit value. The limit value is depicted in FIG. 3 of the drawirnzs as "Reference Value." With such settings, it is possible to deal with changes in the limit value.

When receiving the address data selected with the input data selector 113, the address decoder 112 reads an address corresponding to the received address data from the memory cell array 10. The read data is sent from the memory cell array 10 to the output data selector 124.

A processing of reading data from the memory cell array 10 with the address decoder 112 is executed at timings of the reading processing of FIG. 2. The memory cell array 10 receives the doubled clock from the clock doubling circuit 14, and the data is read therefrom in accordance with the doubled clock. Thus, the reading processing is carried out based on the timings of the doubled clock.

The output data selector 124 sends the read data from the memory cell array 10 toward a selected one of the data holding latches 120 and 121. That is, the output data selector 124 receives a selection signal from the clock doubling circuit 14 to select the data holding latch 120 or the data holding latch 121 and output the data to the selected latch.

The data holding latch 120 receives the read data from the output data selector 124, and then outputs the data to the output data holding flip flop 122. The data holding latch 120 receives the doubled clock from the clock doubling circuit 14 to output the read data based on the doubled clock. Similarly, the data holding latch 121 receives the data from the output data selector 124 and then outputs the data to the output data holding flip flop 123. The data holding latch 121 receives the doubled clock from the clock doubling circuit 14, and then outputs the data based on the doubled clock.

The output data holding flip flop 122 receives the read data from the data holding latch 120, and then outputs the data to the output port A. Here, the data is output at timings (0) to (2) of the output port A of FIG. 2. The output data holding flip flop 122 receives the clock A, not the doubled clock, and then outputs the read data to the output port A in accordance with the clock A.

Likewise, the output data holding flip flop 123 receives the read data from the data holding latch 121 to output the data to the output port B. Here, the data is output at timings (4) to (6)) of the output port B of FIG. 2. The output data holding flip flop 123 receives the clock B, not the doubled clock, and then outputs the data to the output port B in accordance with the clock B.

Based on the above configuration, the input data selector 113 processes the address data from the input data holding flip flops 110 and 111 at double speed in accordance with the doubled clock from the clock doubling circuit 14, thereby allowing the data input from two ports. Further, selecting a higher-frequency clock makes it possible to deal with the input of different clocks. Furthermore, the provision of the phase difference determining circuit 15 makes it possible to deal with a phase shift between the input clocks.

OTHER EMBODIMENTS

In the above embodiment, the clock doubling circuit doubles a clock frequency. However, a three or more-fold clock frequency may be used.

The above embodiment describes the case where two input/output ports are used. However, three or more input/output ports may be used. In this case, the clock doubling circuit 14 chooses the highest-frequency one from all clocks to multiply its clock frequency by the number of input/output ports or more. For example, if three input/output ports are provided, the target clock frequency is multiplied by 3 or more. In addition, the phase difference determining circuit determines all possible phase differences. That is, if n input ports and n output ports are provided, the clock doubling circuit generates a clock having a frequency n times higher than a frequency of the highest-frequency clock out of n input clocks applied to the input port. Further, the phase difference determining circuit determines all possible phase differences among the n input clocks.

It is apparent that the present invention is not limited to the above embodiment that may be modified and changed without departing from the scope and spirit of the invention.

What is claimed is:

1. A multiport memory device, comprising:
   an input data selector for selecting one of input data from a first input port and input data from a second input port;
   a memory cell array to/from which data is written/read based on the input data from the input data selector;
   an output data selector for selecting one of a first output port and a second output port to output read data from the memory cell array; and
   a clock doubling circuit for supplying a doubled clock to the input data selector, the output data selector, and the memory cell array,
   wherein the clock doubling circuit multiplies a frequency of a higher-frequency clock out of a first clock corresponding to data input from only the first input port and a second clock corresponding to data input from only the second input port by 2 or more to obtain and supply the doubled clock.

2. The multiport memory device according to claim 1, further comprising a phase difference determining circuit for detecting a phase difference between the first clock and the second clock to determine whether or not the detected phase difference is equal to or smaller than a predetermined limit value.

3. The multiport memory device according to claim 2, wherein the limit value is rewritable.

4. The multiport memory device according to claim 1, wherein if the first clock and the second clock have a same frequency, the clock doubling circuit selects a clock, a rising edge of which appears in advance of a rising edge of the other clock, to multiply the frequency of the selected clock by 2 or more to obtain and supply the doubled clock.

5. A multiport memory device, comprising:
at least n (n≧2) input ports and n output ports;
an input data selector for selecting one of input data from the at least n (n≧2) input ports;
a memory cell array to/from data is written/read based on the input data from the input data selector;
an output data selector for selecting one of the at least n (n≧2) output ports to output read data from the memory cell array to the selected output port; and
a clock doubling circuit for supplying a doubled clock to the input data selector, the output data selector, and the memory cell array,
wherein the clock doubling circuit selects a highest-frequency clock from n clocks corresponding on a one-to-one basis to data input from the n input ports and multiplies a frequency of the selected clock by n or more to obtain and supply the doubled clock.

6. The multiport memory device according to claim 5, further comprising a phase difference determining circuit for detecting phase differences among the n clocks to determine whether or not the detected phase differences are equal to or smaller than a predetermined limit value.

7. The multiport memory device according to claim 6, wherein the limit value is rewritable.

8. A multiport memory device, comprising:
an input data selector for selecting one of n (n≧2) input ports that operate based on at least two clocks, wherein only one of said at least two clocks corresponds to data input from each of said n input ports;
a memory cell array to/from data is written/read based on input data supplied from the input port selected with the input data selector; and
an output data selector for selecting one of n output ports that operate based on at least two clocks to output read data from the memory cell array,
wherein the input data selector, the memory cell array, and the output data selector are supplied with a doubled clock that is obtained by selecting a highest-frequency clock from the at least two clocks and multiplying a frequency of the selected clock by the number of clocks or more.

9. The multiport memory device according to claim 8, further comprising a clock doubling circuit for generating the doubled clock in accordance with the at least two clocks.

10. The multiport memory device according to claim 8, further comprising a phase difference determining circuit for detecting phase differences among the at least two clocks to determine whether or not the detected phase differences are equal to or smaller than a predetermined limit value.

11. The multiport memory device according to claim 10, wherein if the phase difference is larger than the limit value, the phase difference determining circuit sends a notification that the phase difference is larger than the limit value.

* * * * *